US010528069B2

(12) United States Patent
Hong et al.

(10) Patent No.: US 10,528,069 B2
(45) Date of Patent: Jan. 7, 2020

(54) INTEGRATED CIRCUIT, AND METHOD AND SYSTEM FOR PROVIDING POWER TO INTEGRATED CIRCUIT

(71) Applicant: Samsung Electronics Co., Ltd., Suwon-si, Gyeonggi-do (KR)

(72) Inventors: Hyeokki Hong, Suwon-si (KR); Cheheung Kim, Yongin-si (KR); Sungchan Kang, Hwaseong-si (KR); Jinmyoung Kim, Hwaseong-si (KR); Sangha Park, Seoul (KR); Yongseop Yoon, Seoul (KR); Choongho Rhee, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 3 days.

(21) Appl. No.: 15/869,605

(22) Filed: Jan. 12, 2018

(65) Prior Publication Data
US 2019/0033904 A1    Jan. 31, 2019

(30) Foreign Application Priority Data

Jul. 26, 2017 (KR) .................. 10-2017-0094970

(51) Int. Cl.
*G05F 3/08* (2006.01)
*H03K 19/00* (2006.01)

(52) U.S. Cl.
CPC ........... *G05F 3/08* (2013.01); *H03K 19/0019* (2013.01)

(58) Field of Classification Search
CPC ... G05F 1/00; G05F 1/465; G05F 3/00; G05F 3/08; G05F 3/205; G05F 3/262; G11C 5/00; G11C 5/147; H04B 1/00; H04B 1/1623
(Continued)

(56) References Cited

U.S. PATENT DOCUMENTS 6,111,425 A    8/2000 Bertin et al.
8,476,962 B2   7/2013 Pelley
(Continued)

OTHER PUBLICATIONS

Nipun et al., "Ultra-low power Digital System Design using Sub-threshold logic styles," IEEE Symposium on Industrial Electronics and Applications (ISIEA2011), Sep. 25-28, 2011, p. 109-113.
(Continued)

*Primary Examiner* — Lincoln D Donovan
*Assistant Examiner* — Dave Mattison
(74) *Attorney, Agent, or Firm* — Harness, Dickey & Pierce, P.L.C.

(57) ABSTRACT

An integrated circuit includes a highest class core circuit that has a positive power supply terminal connected to a positive power supply terminal of an external power source, and is configured to receive a first supply voltage which is at least a portion of a an input supply voltage that is provided from the external power source based on an operation throughput; and a lowest class core circuit that has a positive power supply terminal connected to a negative power supply terminal of an adjacent upper class core circuit, has a negative power supply terminal connected to a negative power supply terminal of the external power source, and is configured to receive a second supply voltage which is at least a portion of a part of the input supply voltage that excludes the first supply voltage.

16 Claims, 8 Drawing Sheets

(58) Field of Classification Search
USPC .......................................................... 327/530
See application file for complete search history.

(56) References Cited

U.S. PATENT DOCUMENTS

| | | | |
|---|---|---|---|
| 9,230,614 | B2 | 1/2016 | Schaefer et al. |
| 9,318,420 | B2 | 4/2016 | Kim |
| 9,490,815 | B2 | 11/2016 | Vrudhula et al. |
| 2011/0115554 | A1* | 5/2011 | Pelley ..................... H02M 3/07 |
| | | | 327/538 |

OTHER PUBLICATIONS

Soeleman et al., "Ultra-Low Power Digital Subthreshold Logic Circuits," ISLPED '99 Proceedings of the 1999 international symposium on Low power electronics and design, San Diego, California, USA—Aug. 16-17, 1999, p. 94-96.

* cited by examiner

INTEGRATED CIRCUIT, AND METHOD AND SYSTEM FOR PROVIDING POWER TO INTEGRATED CIRCUIT

CROSS-REFERENCE TO RELATED APPLICATION

This application claims priority under 35 U.S.C. § 119 to Korean Patent Application No. 10-2017-0094970, filed on Jul. 26, 2017, in the Korean Intellectual Property Office (KIPO), the disclosure of which is incorporated herein in its entirety by reference.

BACKGROUND

1. Field

The present disclosure relates to integrated circuits, generally, and more specifically to integrated circuits having hierarchical structures whereby power consumption of the integrated circuits may decrease without increasing areas of the integrated circuits, and methods and systems for providing power to the integrated circuits.

2. Description of the Related Art

In general, an integrated circuit (IC) may include an analog circuit and a digital circuit. In at least some analog circuits and systems, a relatively high supply power is required to increase a signal to noise ratio (SNR), and in at least some digital circuits and systems, a relatively low supply power is used to decrease power consumption. Regarding a method of providing power to an IC in which an analog circuit part and a digital circuit part are combined, research into a power distribution method for preventing, without significantly increasing an area of the IC due to an additional circuit, circuit damage caused by providing excessively high power to the digital circuit has been conducted.

SUMMARY

Provided are integrated circuits and methods and systems for providing power to the integrated circuits.

Additional aspects will be set forth in part in the description which follows and, in part, will be apparent from the description, or may be learned by practice of the presented embodiments.

According to at least some example embodiments, an integrated circuit includes a highest class core circuit that has a positive power supply terminal connected to a positive power supply terminal of an external power source, and is configured to receive a first supply voltage which is at least a portion of a an input supply voltage that is provided from the external power source based on an operation throughput; and a lowest class core circuit that has a positive power supply terminal connected to a negative power supply terminal of an adjacent upper class core circuit, has a negative power supply terminal connected to a negative power supply terminal of the external power source, and is configured to receive a second supply voltage which is at least a portion of a part of the input supply voltage that excludes the first supply voltage.

According to at least some example embodiments, a method of distributing and providing an input supply voltage that is provided from a power source to an integrated circuit including at least a highest class core circuit and a lowest class core circuit includes determining an operation throughput of the highest class core circuit; providing, based on the determined operation throughput of the highest class core circuit, a first supply voltage which is at least a portion of the input supply voltage to the highest class core circuit; and providing a second supply voltage which is at least a portion of a part of the input supply voltage that excludes the first supply voltage to the lowest class core circuit.

According to at least some example embodiments, a system for providing power to an integrated circuit includes a power source that provides an input supply voltage to the integrated circuit through a positive power supply terminal and a negative power supply terminal; a highest class core circuit that has a positive power supply terminal connected to the positive power supply terminal of the power source, and is configured to receive a first supply voltage which is at least a portion of the input supply voltage based on an operation throughput; and a lowest class core circuit that has a positive power supply terminal connected to a negative power supply terminal of an adjacent upper class core circuit, has a negative power supply terminal connected to the negative power supply terminal of the power source, and is configured to receive a second supply voltage which is at least a portion of a part of the input supply voltage that excludes the first supply voltage from the input supply voltage.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
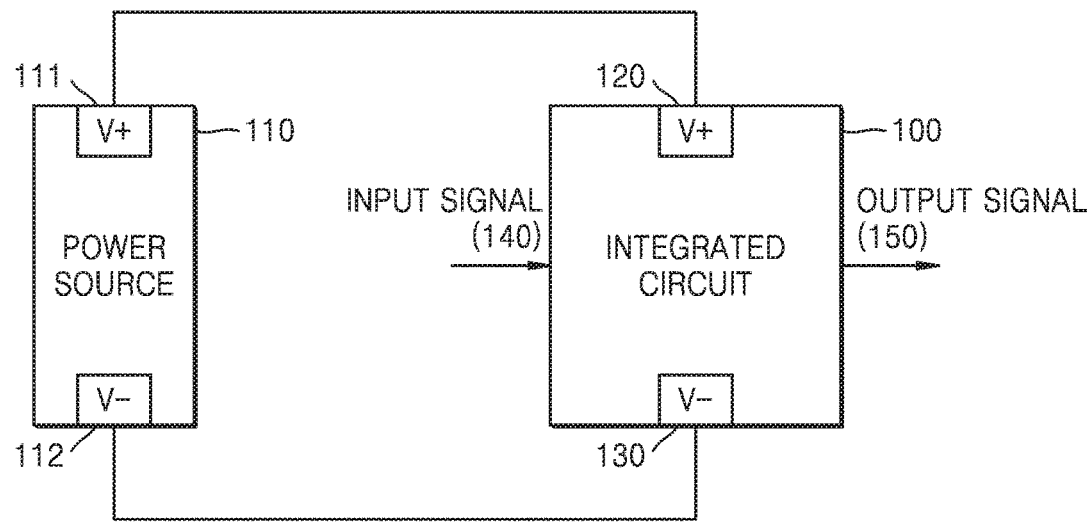
FIG. 1 is a schematic diagram for describing a system for providing power to an integrated circuit, according to at least one example embodiment.

Detailed example embodiments are disclosed herein. However, specific structural and functional details disclosed herein are merely representative for purposes of describing example embodiments. Example embodiments o may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments are described herein with reference to schematic illustrations of idealized embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a schematic diagram for describing a system for providing power to an integrated circuit 100, according to at least one example embodiment.

The power supply system may include the integrated circuit 100 and a power source 110.

The power source 110 may provide a supply voltage to the integrated circuit 100 through a positive power supply terminal 111 and a negative power supply terminal 112. For example, the power source 110 may provide a direct current voltage corresponding to a voltage difference between the positive power supply terminal 111 and the negative power supply terminal 112 to the integrated circuit 100.

The integrated circuit 100 may include, but is not limited to, an analog-digital converter (ADC), a phase lock loop (PLL), a digital signal processor (DSP), a micro controller unit (MCU), a central processing unit (CPU), an application processor (AP), and a memory.

A positive power supply terminal 120 of the integrated circuit 100 may be connected to the positive power supply terminal 111 of the power source 110. Also, a negative power supply terminal 130 of the integrated circuit 100 may be connected to the negative power supply terminal 112 of the power source 110. The integrated circuit 100 may receive a supply voltage from the power source 110 through the positive power supply terminal 120 and the negative power supply terminal 130.

The integrated circuit 100 may generate an output signal 150 by performing operation processing based on a received input signal 140.

The integrated circuit 100 may include a plurality of digital circuits for performing operation processing by using a digital input signal, a plurality of analog circuits for performing operation processing by using an analog input signal, or a combination thereof. The digital input signal may be a sequence of discrete values. For example, the digital input signal may include a sequence of a high voltage value and a low voltage value. In this regard, the digital input signal may be changed from a low voltage to a high voltage or from a high voltage to a low voltage.

The integrated circuit 100 may include a plurality of circuits. In this regard, the plurality of circuits may be core circuits which are main processing circuits inside a processor such as a microprocessor. Also, the plurality of core circuits may operate independently of each other.

Figure 2:
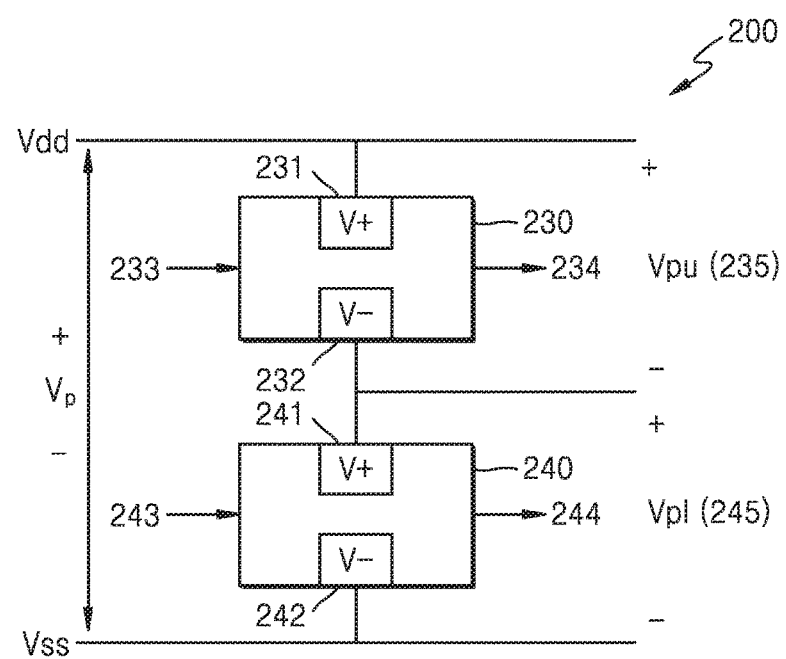
FIG. 2 is a diagram of an integrated circuit according to at least one example embodiment.

FIG. 2 is a diagram of an integrated circuit 200 according to at least one example embodiment. The integrated circuit 200 of FIG. 2 is an example of the integrated circuit 100 of FIG. 1.

The integrated circuit 200 may include a plurality of circuits, 230 and 240. According to at least some example embodiments, each of the circuits 230 and 240 of the integrated circuit 200 is assigned to a class from among a plurality of classes, and the plurality of classes may be ranked from a lowest class to a highest class. For example, in the example illustrated in FIG. 2, the plurality of classes includes at least two classes: a highest class and a lowest class. Further, in the example illustrated in FIG. 2, the circuit 230 is assigned to the highest class and the circuit 240 is assigned to the lowest class. The plurality of circuits, for example, the highest class circuit 230 and the lowest class circuit 240, may receive a supply voltage Vp through the positive power supply terminal 111 (of FIG. 1) and the negative power supply terminal 112 (of FIG. 1) of the external power source 110 (of FIG. 1), the positive power supply terminal 111 having a voltage Vdd and the negative power supply terminal 112 having a voltage Vss.

Referring to FIG. 2, the integrated circuit 200 may include the highest class circuit 230 and the lowest class circuit 240. Also, the highest class circuit 230 and the lowest class circuit 240 may be core circuits for performing operation processing independently of each other.

A positive power supply terminal 231 of the highest class circuit 230 may be connected to the positive power supply terminal 111 of the external power source 110 (of FIG. 1). Also, a negative power supply terminal 232 of the highest class circuit 230 may be connected to a positive power supply terminal of an adjacent lower class circuit. For example, the negative power supply terminal 232 of the highest class circuit 230 may be connected to a positive power supply terminal 241 of the lowest class circuit 240.

The positive power supply terminal 241 of the lowest class circuit 240 may be connected to a negative power supply terminal of an adjacent upper class circuit. For example, the positive power supply terminal 241 of the lowest class circuit 240 may be connected to the negative power supply terminal 232 of the highest class circuit 230. Also, a negative power supply terminal 242 of the lowest class circuit 240 may be connected to the negative power supply terminal 112 of the external power source 110 (of FIG. 1).

The highest class circuit 230 may receive an input signal 233. Also, the lowest class circuit 240 may receive an input signal 243. For example, the input signal 233 and the input signal 243 may be digital input signals or analog input signals.

The highest class circuit 230 may generate an output signal 234 by performing operation processing based on the received input signal 233. Also, the lowest class circuit 240 may generate an output signal 244 by performing operation processing based on the received input signal 243.

The highest class circuit 230 may receive a supply voltage Vpu 235 which is at least a portion of the supply voltage Vp provided from the external power source 110 (of FIG. 1) based on an operation throughput. The supply voltage Vp provided from the external power source 110 may also be referred to, in the present disclosure, as the input supply voltage Vp. Also, the operation throughput of the highest class circuit 230 may depend on the input signal 233 received by the highest class circuit 230. For example, the operation throughput of the highest class circuit 230 may depend on a change frequency of the input signal 233 received by the highest class circuit 230. In this regard, as the change frequency of the input signal 233 received by the highest class circuit 230 increases, the operation throughput of the highest class circuit 230 may increase.

As the operation throughput of the highest class circuit 230 increases, the supply voltage Vpu 235 provided to the highest class circuit 230 may decrease. Also, as the change frequency of the input signal 233 received by the highest class circuit 230 increases, the supply voltage Vpu 235 provided to the highest class circuit 230 may decrease.

The lowest class circuit 240 may receive a supply voltage Vpl 245 which is at least a portion of the part of the supply voltage Vp provided from the external power source 110 (of FIG. 1) that excludes the supply voltage Vpu 235 provided to the highest class circuit 230 (e.g., at least a portion of a part of the supply voltage Vp that excludes the supply voltage Vpu).

A distribution ratio between the supply voltage Vpu 235 provided to the highest class circuit 230 and the supply voltage Vpl 245 provided to the lowest class circuit 240 from the supply voltage Vp provided from the external power source 110 (of FIG. 1) may be determined based on the operation throughput of the highest class circuit 230 and an operation throughput of the lowest class circuit 240. Accordingly, the distribution ratio between the supply voltage Vpu 235 provided to the highest class circuit 230 and the supply voltage Vpl 245 provided to the lowest class circuit 240 from the supply voltage Vp provided from the external power source 110 (of FIG. 1) may be time variant.

Also, the distribution ratio between the supply voltage Vpu 235 of the highest class circuit 230 and the supply voltage Vpl 245 of the lowest class circuit 240 from the supply voltage Vp provided from the external power source 110 (of FIG. 1) may be determined by system complexity of the highest class circuit 230 and system complexity of the lowest class circuit 240. In this regard, the system complexity may be determined by a type and size of a device constituting a circuit and the number of devices. For example, when the system complexity of the highest class circuit 230 is greater than the system complexity of the lowest class circuit 240, the supply voltage Vpu 235 of the highest class circuit 230 may be greater than the supply voltage Vpl 245.

Figure 3:
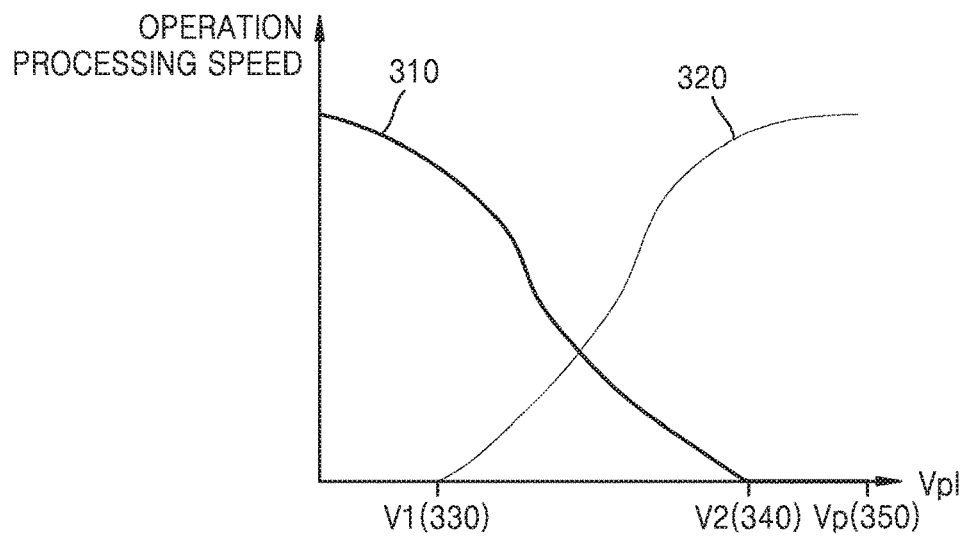
FIG. 3 is a graph showing a relationship between a voltage provided to a circuit and an operation processing speed, according to at least one example embodiment.

FIG. 3 is a graph showing a relationship between a voltage provided to a circuit and an operation processing speed, according to at least one example embodiment.

Referring to FIG. 3, the horizontal axis of the graph denotes the supply voltage Vpl 245, which is a supply voltage that is provided to the lowest class circuit 240. Also, the vertical axis of the graph denotes an operation processing speed of a circuit.

In FIG. 3, a first curve 310 denotes an operation processing speed of the highest class circuit 230 according to the supply voltage Vpl 245 of FIG. 2. Also, a second curve 320 denotes an operation processing speed of the lowest class circuit 240 according to the supply voltage Vpl 245 of FIG. 2.

When an input supply voltage Vp 350 that is provided from the external power source 110 (of FIG. 1) is constant, a supply voltage Vpu 235 decreases as the supply voltage Vpl 245 of FIG. 2 increases, and the supply voltage Vpu 235 increases as the supply voltage Vpl 245 decreases. Changes of the operation processing speed of the highest class circuit 230 and the operation processing speed of the lowest class circuit 240 based on the supply voltage Vpl 245 of FIG. 2 will be described for convenience with reference to FIG. 3.

Referring to the first curve 310, as the supply voltage Vpl 245 of FIG. 2 increases, the supply voltage Vpu 235 decreases, and accordingly, the operation processing speed of the highest class circuit 230 decreases. Also, when the supply voltage Vpl 245 is V2 340, the supply voltage Vpu 235 may have a threshold voltage of the highest class circuit 230, and the operation processing speed of the highest class circuit 230 is 0.

Referring to the second curve 320, a change of the operation processing speed of the lowest class circuit 240 has an opposite trend to the change of the operation processing speed of the highest class circuit 230. For example, the operation processing speed of the lowest class circuit 240 is 0 during a section in which the supply voltage Vpl 245 increases from 0 to V1 330 which is a threshold voltage of the lowest class circuit 240. Also, the operation processing speed of the lowest class circuit 240 increases during a section in which the supply voltage Vpl 245 increases beyond the threshold voltage of the lowest class circuit 240.

As described above with reference to FIG. 2, when an operation throughput of the lowest class circuit 240 is constant, as an operation throughput of the highest class circuit 230 increases, the supply voltage Vpu 235 provided to the highest class circuit 230 may decrease, and the supply voltage Vpl 245 provided to the lowest class circuit 240 may increase. Accordingly, when the operation throughput of the lowest class circuit 240 is constant, and the operation throughput of the highest class circuit 230 increases, the operation processing speed of the highest class circuit 230 may decrease, and the operation processing speed of the lowest class circuit 240 may increase.

Also, when the operation processing speed of the lowest class circuit 240 is constant, as the operation throughput of the highest class circuit 230 decreases, the supply voltage Vpu 235 provided to the highest class circuit 230 may increase, and the supply voltage Vpl 245 provided to the lowest class circuit 240 may decrease. Accordingly, the operation processing speed of the highest class circuit 230 may increase, and the operation processing speed of the lowest class circuit 240 may decrease.

Figure 4:
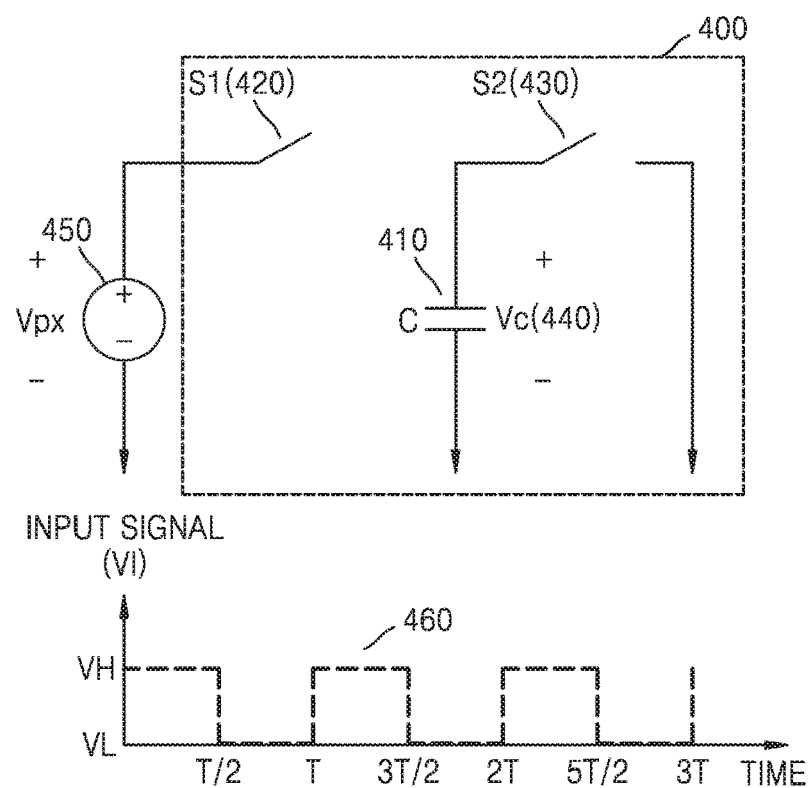
FIG. 4 is a diagram of an example input signal and a modeled circuit for describing a factor that influences power consumption of a circuit, according to at least one example embodiment.

FIG. 4 is a diagram of an example input signal and a modeling circuit for describing a factor that influences power consumption of a circuit, according to at least one example embodiment.

A circuit that constitutes an integrated circuit may include a transistor, and the transistor may be modeled as a circuit including a switch that operates according to an input signal and a capacitor.

A power source 450 of FIG. 4 may provide a supply voltage Vpx to a modeling circuit 400. The modeling circuit 400 may include two switches S1 420 and S2 430 that are open and closed based on a received input signal VI. The modeling circuit 400 may include a capacitor 410 having a capacitance C. The capacitance C of the capacitor 410 may denote complexity of a circuit. For example, as complexity of a circuit increases, the capacitor C of the capacitor 410 of the modeling circuit 400 may increase.

The input signal VI may be a digital input signal which is a sequence of a high voltage VH or a low voltage VL. For example, the low voltage VL may be 0 V.

Referring to FIG. 4, a graph 460 denotes the input signal VI according to time. The input signal VI may have a certain cycle T, and may have the high voltage VH and the low voltage VL that are alternately repeated during the same period T/2. Accordingly, a reciprocal 1/T of the cycle T of the input signal VI having the high voltage VH and the low voltage VL that are alternately repeated may denote a change frequency of the input signal VI.

While the input signal VI is the high voltage VH, the switch S1 420 may be closed and the switch S2 430 may be open. Also, while the input signal VI is the low voltage VL, the switch S1 420 may be open and the switch S2 430 may be closed.

In a section where time passes from 0 to T/2, electric charges of C×Vpx, which is the amount of electric charges proportional to a voltage Vc 440 of both ends of the capacitor 410, are accumulated in the capacitor 410, and in a section where time passes from T/2 to T, the electric charges accumulated in the capacitor 410 are discharged through a ground part.

During one cycle T, the amount of electric charges provided from the power source 450 to a circuit is C×Vpx. Thus, an average current that flows from the power source 450 may be C×Vpx/T, and an average power provided from the power source 450 may be C×Vpx$^2$/T. Accordingly, based on the law of conservation of energy, power consumption of the circuit may be C×Vpx$^2$/T, which is the same as the average power provided from the power source 450.

Accordingly, power consumption of the circuit may be proportional to a square of the input supply voltage Vp that the circuit receives, complexity of the circuit, and a change frequency of the input signal VI. In this regard, when the change frequency of the input signal VI of the circuit and the complexity of the circuit are constant, power consumption of the circuit may decrease as the supply voltage Vpx provided to the circuit decreases.

Figure 5:
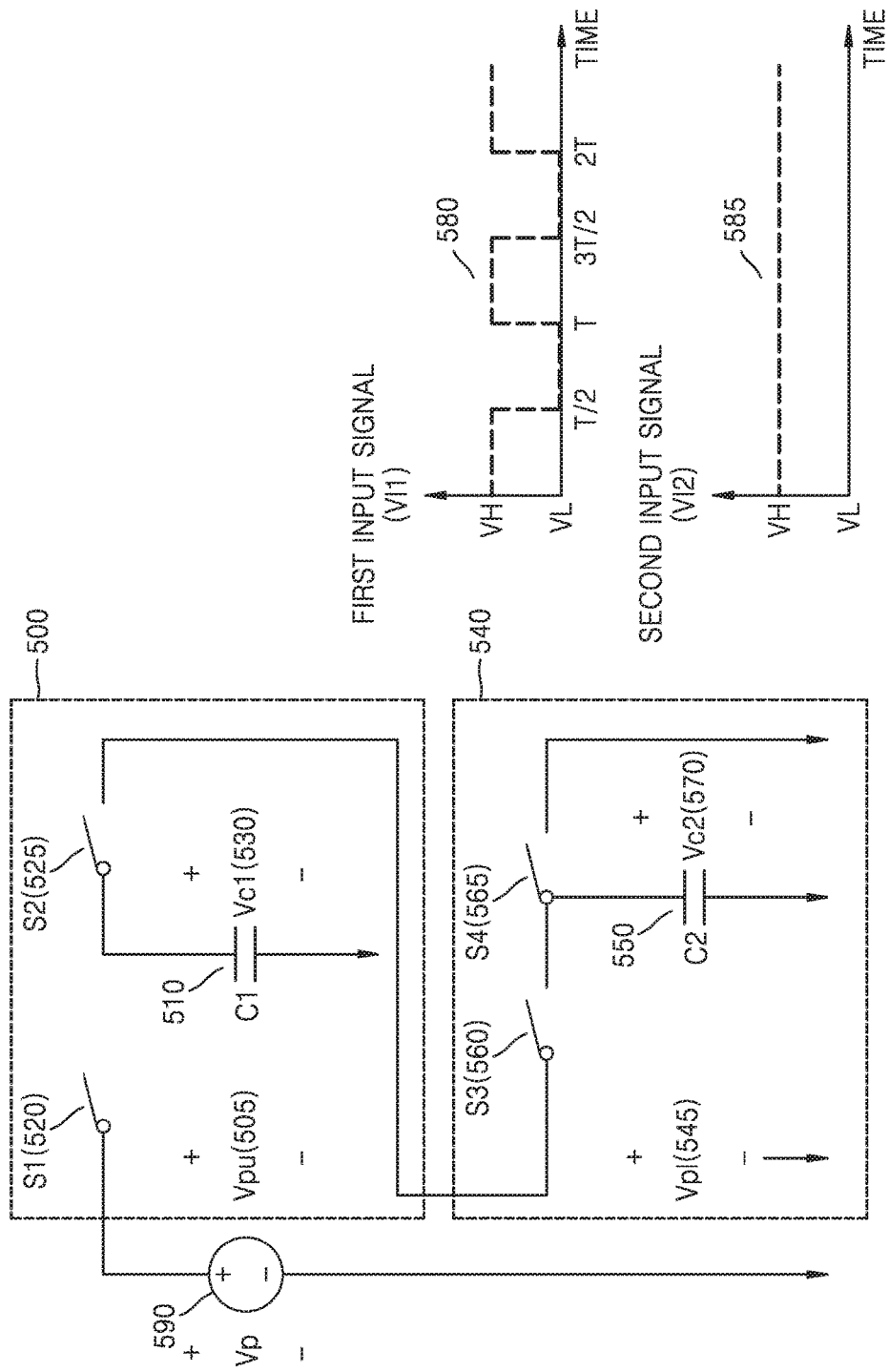
FIG. 5 is a diagram for describing a relationship between a change frequency of an input signal that is input to each of a plurality of classes of circuits and a supply voltage that is distributed to each of a plurality of circuits, according to at least one example embodiment.

FIG. 5 is a diagram for describing a relationship between a change frequency of an input signal that is input to each of a plurality of classes of circuits and a supply voltage that is distributed to each of a plurality of circuits, according to at least one example embodiment.

Referring to FIG. 5, a first modeling circuit 500 is a circuit resulting from modeling of an example of the highest class circuit 230 of FIG. 2. Also, a second modeling circuit 540 is a circuit resulting from modeling of an example of the lowest class circuit 240 of FIG. 2.

A supply voltage Vpu 505 that is provided to the first modeling circuit 500 corresponds to the supply voltage Vpu 235 that is provided to the highest class circuit 230 of FIG. 2. Also, a supply voltage Vpl 545 that is provided to the second modeling circuit 540 corresponds to the supply voltage Vpl 245 that is provided to the lowest class circuit 240 of FIG. 2.

The first modeling circuit 500 may include a first capacitor 510 having a first capacitance C1. Also, the second modeling circuit 540 may include a second capacitor 550 having a second capacitance C2. As described above with reference to FIG. 4, the first capacitance C1 may denote system complexity of the highest class circuit 230 of FIG. 2 corresponding to the first modeling circuit 500. Also, the second capacitance C2 may denote system complexity of the lowest class circuit 240 of FIG. 2 corresponding to the second modeling circuit 540.

Referring to FIG. 5, a graph 580 denotes a first input signal VI1 that is received by the first modeling circuit 500. Also, a graph 585 denotes a second input signal VI2 that is received by the second modeling circuit 540.

The first modeling circuit 500 may include a switch S1 520 and a switch S2 525. The opening and closing of the switch S1 520 and the opening and closing of the switch S2 525 may be determined based on the first input signal VI1. For example, while the first input signal VI1 is the high voltage VH, the switch S1 520 may be closed and the switch S2 525 may be open. Also, while the first input signal VI1 is the low voltage VL, the switch S1 520 may be open and the switch S2 525 may be closed.

The second modeling circuit 540 may include a switch S3 560 and a switch S4 565. The opening and closing of the switch S3 560 and the opening and closing of the switch S4 565 may be determined based on the second input signal VI2. For example, while the second input signal VI2 is the high voltage VH, the switch S3 560 may be closed and the switch S4 565 may be open. Also, while the second input signal VI2 is the low voltage VL, the switch S3 560 may be open and the switch S4 565 may be closed.

Referring to FIG. 5, a change frequency of the first input signal VI1 may be greater than that of the second input signal VI2. Referring to the graph 580, a cycle of the first input signal VI1 is T, and the first input signal VI1 changes from the high voltage VH to the low voltage VL or from the low voltage VL to the high voltage VH every T/2. Referring to a graph 585, the second input signal VI2 maintains the high voltage VH and does not change.

Since the second input signal VI2 of FIG. 5 maintains the high voltage VH, the switch S3 560 of the second modeling circuit 540 may be kept closed, and the switch S4 565 may be kept open. Also, at a first phase where the first input signal VI1 is the high voltage VH, the switch S1 520 may be closed and the switch S2 525 may be open. Also, at a second phase where the first input signal VI1 is the low voltage VL, the switch S1 520 may be open and the switch S2 525 may be closed.

At the first phase, as the supply voltage Vpu 505, which is a portion of the supply voltage Vp, is provided from a power source 590, electric charges may be accumulated in the first capacitor 510 from the power source 590. Also, as electric charges are accumulated in the first capacitor 510, a voltage Vc1 530 of both ends of the first capacitor 510 may increase.

At the second phase, the electric charges accumulated in the first capacitor 510 may travel via a path that is connected as the switch S2 525 and the switch S3 560 are closed, and thus, may be accumulated in the second capacitor 550. In this regard, as the electric charges of the first capacitor 510 are discharged, the voltage Vc1 530 of both ends of the first capacitor 510 may decrease.

As the first phase and the second phase are alternately repeated, the amount of electric charges accumulated in the second capacitor 550 may increase, and accordingly, a voltage Vc2 570 of both ends of the second capacitor 550 may increase. In this regard, as the second capacitance C2 of the second capacitor 550 increases, an increase in the voltage Vc2 570 of both ends of the second capacitor 550 that increases as electric charges travel from the first capacitor 510 and are accumulated in the second capacitor 550 may decrease.

Referring to FIG. 5, since the switch S3 560 is closed, the supply voltage Vpl 545 that is provided to the second modeling circuit 540 and the voltage Vc2 570 of both ends of the second capacitor 550 are the same as each other. Accordingly, as the second capacitance C2 of the second capacitor 550 increases, an increase in the supply voltage Vpl 545 that increases as electric charges travel from the first capacitor 510 and are accumulated in the second capacitor 550 may decrease.

Also, as the first phase and the second phase are alternately repeated, the supply voltage Vpl 545 that is provided to the second modeling circuit 540 may increase. In this regard, since a total of the supply voltage Vpu 505 that is provided to the first modeling circuit 500 and the supply voltage Vpl 545 that is provided to the second modeling circuit 540 is constant as the input supply voltage Vp of the power source 590, the supply voltage Vpu 505 may decrease as the supply voltage Vpl 545 increases.

Accordingly, when a change frequency of the first input signal VI1 that is received by the first modeling circuit 500 corresponding to the highest class circuit 230 of FIG. 2 is greater than that of the second input signal VI2 that is received by the second modeling circuit 540, the supply voltage Vpu 505 that is provided to the first modeling circuit 500 may decrease, and the supply voltage Vpl 545 that is provided to the second modeling circuit 540 may increase.

Figure 6:
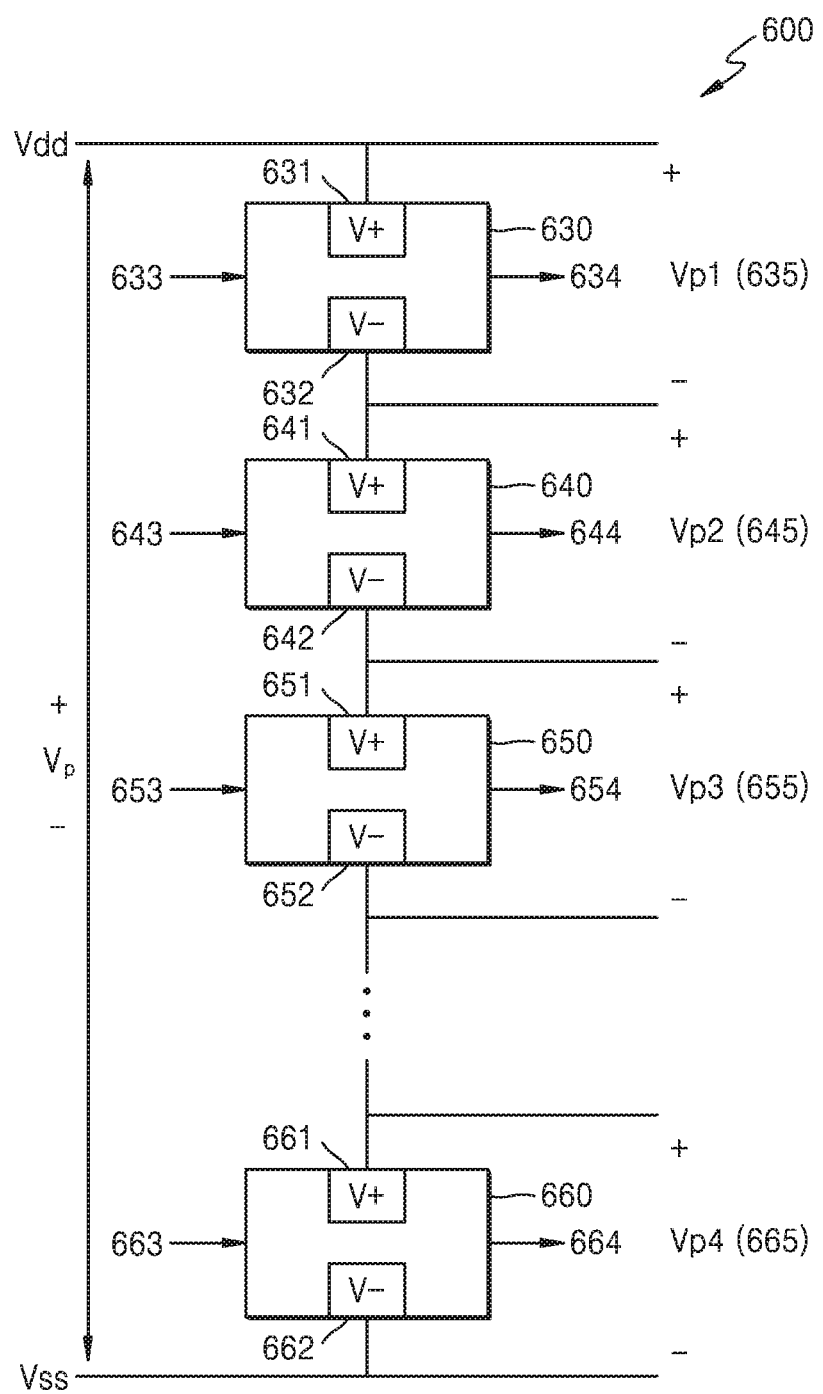
FIG. 6 is a diagram of an integrated circuit according to at least another example embodiment.

FIG. 6 is a diagram of an integrated circuit 600 according to another embodiment. The integrated circuit 600 of FIG. 6 is an example of the integrated circuit 100 of FIG. 1.

Referring to FIG. 6, the integrated circuit 600 may include a highest class circuit 630, a middle class circuit 640 and a middle class circuit 650 belonging to different middle classes, and a lowest class circuit 660. Thus, according to at least some example embodiments, each of circuits 630-660 is a assigned to a different class from among a plurality of classes, and the plurality of classes may be ranked from a lowest class (e.g., the class to which the circuit 660 is assigned) to a highest class (e.g., the class to which the circuit 630 is assigned).

The integrated circuit 600 may receive the input supply voltage Vp through the positive power supply terminal 111 (of FIG. 1) and the negative power supply terminal 112 (of FIG. 1) of the external power source 110 (of FIG. 1), the positive power supply terminal 111 having the voltage Vdd and the negative power supply terminal 112 having the voltage Vss.

The highest class circuit 630, the middle class circuit 640, the middle class circuit 650, and the lowest class circuit 660 may respectively include positive power supply terminals 631, 641, 651, and 661 and negative power supply terminals 632, 642, 652, and 662.

Also, the highest class circuit 630, the middle class circuit 640, the middle class circuit 650, and the lowest class circuit 660 may perform operation processing by respectively using received input signals 633, 643, 653, and 663 and thus may generate output signals 634, 644, 654, and 664.

The positive power supply terminal 631 of the highest class circuit 630 may be connected to the positive power supply terminal 111 (of FIG. 1) of the external power source 110 (of FIG. 1). Also, a negative power supply terminal of each of the circuits belonging to a class other than the lowest class circuit may be connected to a positive power supply terminal of an adjacent lower class circuit.

For example, the negative power supply terminal 632 of the highest class circuit 630 may be connected to the positive power supply terminal 641 of the middle class circuit 640. Also, the positive power supply terminal 641 of the middle class circuit 640 may be connected to the negative power supply terminal 632 of the highest class circuit 630, and the positive power supply terminal 651 of the middle class circuit 650 may be connected to the negative power supply terminal 642 of the middle class circuit 640, which is an adjacent upper class circuit. Also, the positive power supply terminal 661 of the lowest class circuit 660 may be connected to a negative power supply terminal of an adjacent upper class circuit (not shown). Also, the negative power supply terminal 662 of the lowest class circuit 660 may be connected to the negative power supply terminal 112 (of FIG. 1) of the external power source 110 (of FIG. 1).

The highest class circuit 630 may receive a supply voltage Vp1 635 which is at least a portion of a supply voltage provided from the external power source 110 (of FIG. 1) based on an operation throughput. Also, the lowest class circuit 660 may receive a supply voltage Vp4 665 which is at least a portion of the part of the supply voltage provided from the external power source 110 (of FIG. 1) that excludes the supply voltage Vp1 635 provided to the highest class circuit 630. Also, the middle class circuit 640 may receive a supply voltage Vp2 645 which is at least a portion of the part of the supply voltage provided from the external power source 110 (of FIG. 1) that excludes the supply voltage Vp1 635 and the supply voltage Vp4 665. Also, the middle class circuit 650 may receive a supply voltage Vp3 655 which is at least a portion of the part of the supply voltage provided from the external power source 110 (of FIG. 1) that excludes the supply voltage Vp1 635, the supply voltage Vp4 665, and the supply voltage Vp2 645.

A distribution ratio between the supply voltage Vp1 635, the supply voltage Vp2 645, the supply voltage Vp3 655, and the supply voltage Vp4 665 respectively distributed and provided to the highest class circuit 630, the middle class circuit 640, the middle class circuit 650, and the lowest class circuit 660 from the supply voltage provided from the external power source 110 (of FIG. 1) may be determined based on respective operation throughputs of the highest class circuit 630, the middle class circuit 640, the middle class circuit 650, and the lowest class circuit 660. Also, the respective operation throughputs of the highest class circuit 630, the middle class circuit 640, the middle class circuit 650, and the lowest class circuit 660 are determined based on change frequencies of the input signals 633, 643, 653, and 663 respectively received by the highest class circuit 630, the middle class circuit 640, the middle class circuit 650, and the lowest class circuit 660.

A distribution ratio between the supply voltages 635, 645, 655, and 665 respectively provided to the plurality of classes of circuits 630, 640, 650, and 660 may be determined based on a ratio between the change frequencies of the input signals 633, 643, 653, and 663 respectively received by the plurality of classes of circuits 630, 640, 650, and 660. For example, a supply voltage of a circuit that receives an input signal having a relatively high change frequency may decrease.

Also, the distribution ratio between the supply voltage Vp1 635, the supply voltage Vp2 645, the supply voltage Vp3 655, and the supply voltage Vp4 665 respectively distributed and provided to the highest class circuit 630, the middle class circuit 640, the middle class circuit 650, and the lowest class circuit 660 from the supply voltage provided from the external power source 110 (of FIG. 1) may be determined based on respective system complexities of the highest class circuit 630, the middle class circuit 640, the middle class circuit 650, and the lowest class circuit 660.

Figure 7:
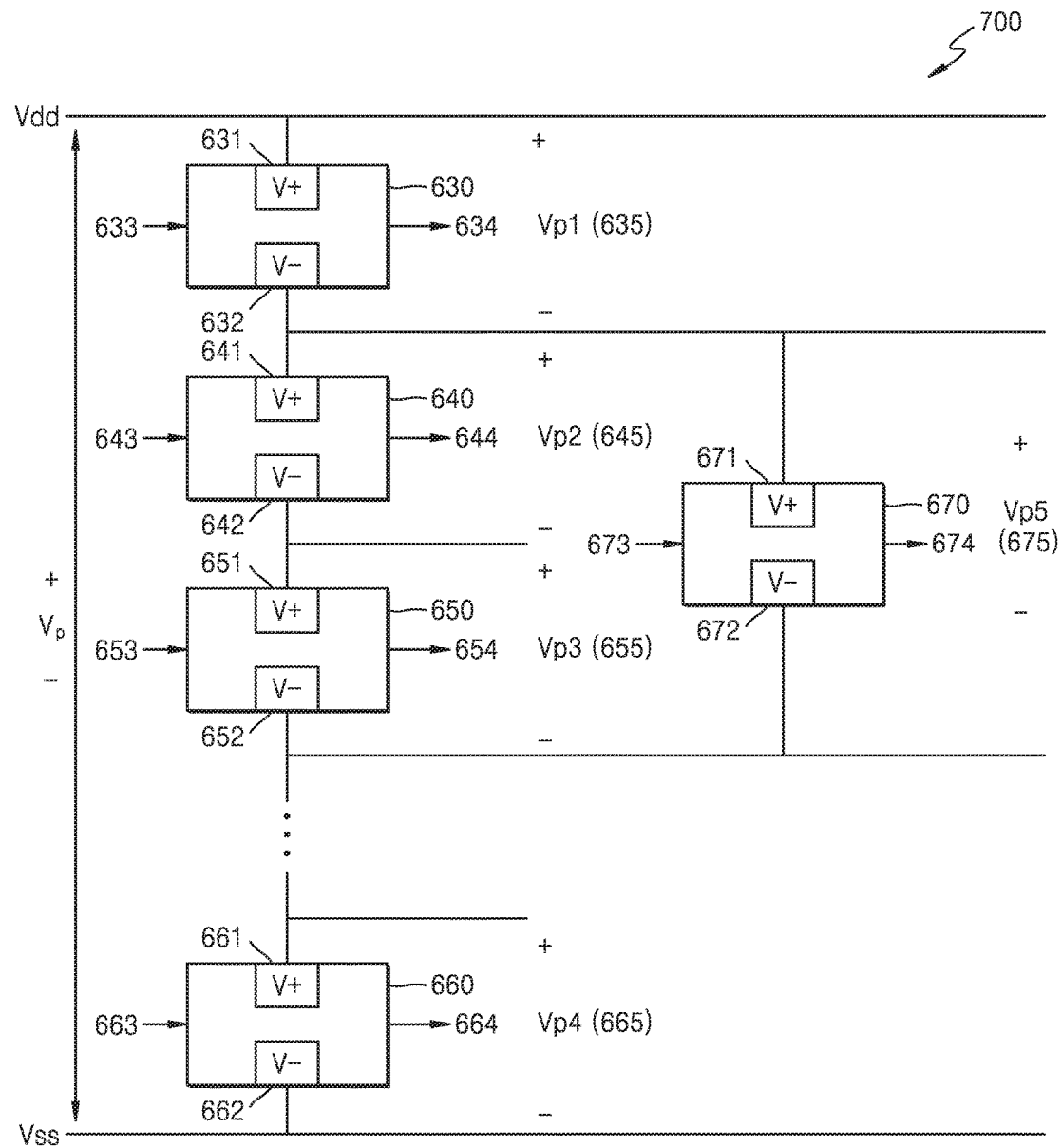
FIG. 7 is a diagram of an integrated circuit including a plurality of classes of circuits and a complex class circuit belonging to at least two different classes, according to at least one example embodiment.

FIG. 7 is a diagram of an integrated circuit 700 including the plurality of classes of circuits 630, 640, 650, and 660 and a complex class circuit 670 belonging to at least two different classes, according to at least one example embodiment. The integrated circuit 700 of FIG. 7 is an example of the integrated circuit 100 of FIG. 1.

Referring to FIG. 7, the integrated circuit 700 may include the highest class circuit 630, the middle class circuit 640, the middle class circuit 650, and the lowest class circuit 660 illustrated in FIG. 6. Regarding FIG. 7, repeated descriptions of the highest class circuit 630, the middle class circuit 640, the middle class circuit 650, and the lowest class circuit 660 will be replaced with the corresponding descriptions given with reference to FIG. 6.

A positive power supply terminal 671 of the complex class circuit 670 may be connected to the positive power supply terminal 641 of the middle class circuit 640 belonging to a first class except the lowest class circuit 660 from among the plurality of classes of circuits 630, 640, 650, and 660. Also, a negative power supply terminal 672 of the complex class circuit 670 may be connected to the negative power supply terminal 652 of the middle class circuit 650 belonging to a second class which is a lower class circuit than the middle class circuit 640 belonging to the first class from among the plurality of classes of circuits 630, 640, 650, and 660.

The complex class circuit 670 may receive a supply voltage Vp5 675 which is at least a portion of the part of a supply voltage provided from the external power source 110 (of FIG. 1) that excludes a supply voltage provided to a circuit belonging to an higher class than the class of the circuit 640 (i.e., the first class) and excludes a supply voltage provided to a circuit belonging to a lower class than the class of the circuit 650 (i.e., the second class).

The supply voltage Vp5 675 according to at least one example embodiment may be determined based on at least one of an operation throughput of the middle class circuit 640, an operation throughput of the middle class circuit 650, and an operation throughput of the complex class circuit 670. For example, the supply voltage Vp5 675 may decrease as at least one of the operation throughput of the middle class circuit 640, the operation throughput of the middle class circuit 650, and the operation throughput of the complex class circuit 670 increases.

The operation throughput of the complex class circuit 670 depends on a change frequency of an input signal 673 received by the complex class circuit 670. For example, as the change frequency of the input signal 673 increases, the operation throughput of the complex class circuit 670 may increase.

Figure 8:
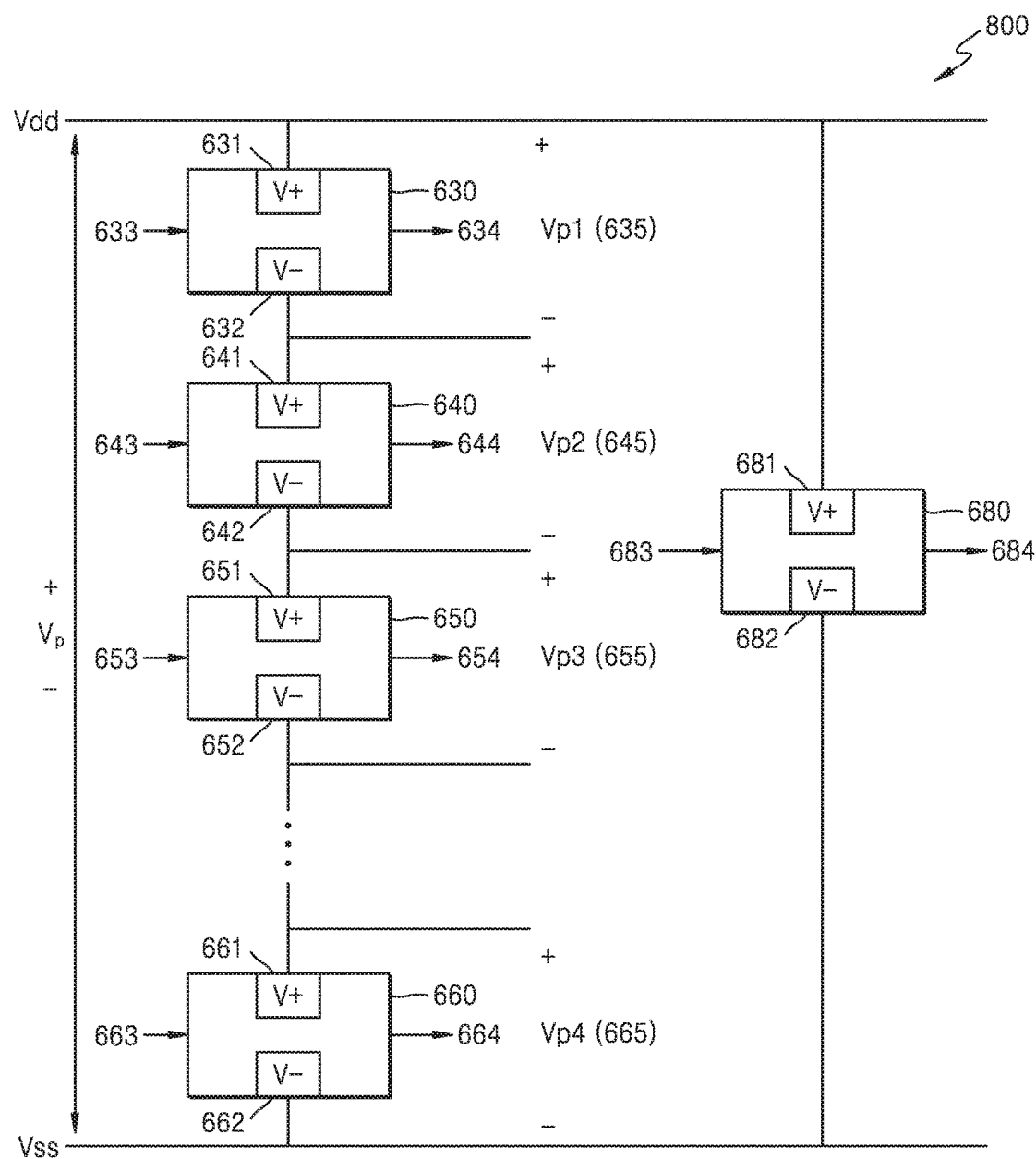
FIG. 8 is a diagram of an integrated circuit including a plurality of classes of circuits and a single class circuit, according to at least one example embodiment.

FIG. 8 is a diagram of an integrated circuit 800 including the plurality of classes of circuits 630, 640, 650, and 660 and a single class circuit 680, according to at least one example embodiment. The integrated circuit 800 of FIG. 8 is an example of the integrated circuit 100 of FIG. 1.

Referring to FIG. 8, the integrated circuit 800 may include the highest class circuit 630, the middle class circuit 640, the middle class circuit 650, and the lowest class circuit 660 illustrated in FIG. 6. Regarding FIG. 8, repeated descriptions of the highest class circuit 630, the middle class circuit 640, the middle class circuit 650, and the lowest class circuit 660 will be replaced with the corresponding descriptions given with reference to FIG. 6.

Referring to FIG. 8, the integrated circuit 800 may include the single class circuit 680. A positive power supply terminal 681 of the single class circuit 680 may be connected to the positive power supply terminal 111 (of FIG. 1) of the external power source 110 (of FIG. 1). Also, a negative power supply terminal 682 of the single class circuit 680 may be connected to the negative power supply terminal 112 (of FIG. 1) of the external power source 110 (of FIG. 1).

A supply voltage that is provided to the single class circuit 680 may be the same as a supply voltage of the external power source 110 (of FIG. 1). Also, a range of an output signal 674 of the single class circuit 680 may be greater than that of an output signal of each of the plurality of classes of circuits.

The supply voltage Vp1 635, the supply voltage Vp2 645, the supply voltage Vp3 655, and the supply voltage Vp4 665 that are distributed and provided to the highest class circuit 630, the middle class circuit 640, the middle class circuit 650, and the lowest class circuit 660 may be determined independently of an operation throughput of the single class circuit 680.

Figure 9:
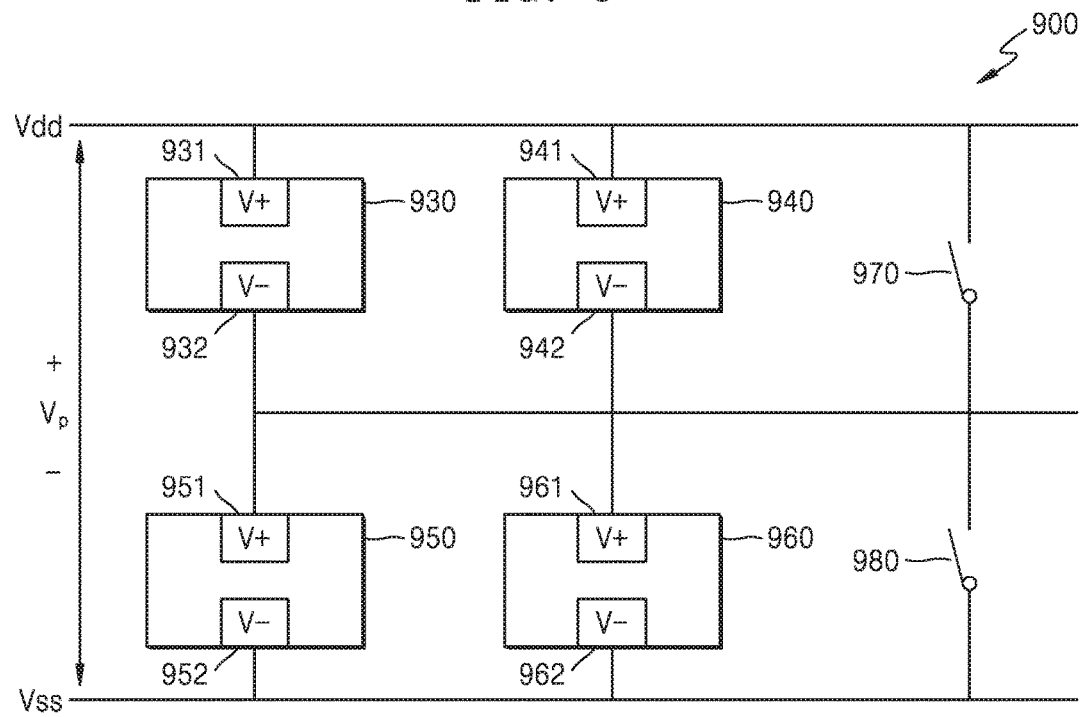
FIG. 9 is a diagram of an integrated circuit including a plurality of classes of circuits, a voltage supply of which is controlled through a switch, according to at least one example embodiment.

FIG. 9 is a diagram of an integrated circuit 900 including a plurality of classes of circuits 930, 940, 950, and 960, a voltage supply of which is controlled through switches 970 and 980, according to at least one example embodiment. The integrated circuit 900 of FIG. 9 is an example of the integrated circuit 100 of FIG. 1.

The integrated circuit 900 may receive the input supply voltage Vp through the positive power supply terminal 111 (of FIG. 1) and the negative power supply terminal 112 (of FIG. 1) of the external power source 110 (of FIG. 1), the positive power supply terminal 111 having the voltage Vdd and the negative power supply terminal 112 having the voltage Vss.

The integrated circuit 900 may include the plurality of classes of circuits 930, 940, 950, and 960. For example, the plurality of classes of circuits 930, 940, 950, and 960 may be core circuits. According to at least some example embodiments, each of circuits 930-960 is assigned to a class from among a plurality of classes, and the plurality of classes may be ranked from a lowest class to a highest class. For example, in the example illustrated in FIG. 9, the plurality of classes includes at least two classes: a highest class and a lowest class. Further, in the example illustrated in FIG. 9, circuits 930 and 940 are assigned to the highest class and circuits 950 and 960 are assigned to the lowest class.

For example, the integrated circuit 900 may include a plurality of circuits 930 and 940 belonging to the highest class and a plurality of circuits 950 and 960 belonging to the lowest class.

Positive power supply terminals 931 and 941 of the plurality of circuits 930 and 940 belonging to the highest class may be connected to each other. Also, the positive power supply terminals 931 and 941 of the plurality of circuits 930 and 940 belonging to the highest class may be connected to the positive power supply terminal 111 (of FIG. 1) of the external power source 110 (of FIG. 1).

Negative power supply terminals 932 and 942 of the plurality of circuits 930 and 940 belonging to the highest class may be connected to each other. Also, the negative power supply terminals 932 and 942 of the plurality of circuits 930 and 940 belonging to the highest class may be connected to a positive power supply terminal of an adjacent lower class circuit.

Positive power supply terminals 951 and 961 of the plurality of circuits 950 and 960 belonging to the lowest class may be connected to each other. Also, the positive power supply terminals 951 and 961 of the plurality of circuits 950 and 960 belonging to the lowest class may be connected to a negative power supply terminal of an adjacent upper class circuit, for example, the negative power supply terminals 932 and 942 of the plurality of circuits 930 and 940 belonging to the highest class. Negative power supply terminals 952 and 962 of the plurality of circuits 950 and 960 belonging to the lowest class may be connected to each other. Also, the negative power supply terminals 952 and 962 of the plurality of circuits 950 and 960 belonging to the lowest class may be connected to the negative power supply terminal 112 (of FIG. 1) of the external power source 110 (of FIG. 1).

The integrated circuit 900 may include the switches 970 and 980 for connecting the positive power supply terminals 931, 941, 951, and 961 and the negative power supply terminals 932, 942, 952, and 962 of the circuits 930, 940, 950, and 960 belonging to the plurality of classes. For example, the integrated circuit 900 may include the switch 970 for connecting the positive power supply terminals 931 and 941 and the negative power supply terminals 932 and 942 of the circuits 930 and 940 belonging to the highest class. Also, the integrated circuit 900 may include the switch 980 for connecting the positive power supply terminals 951 and 961 and the negative power supply terminals 952 and 962 of the circuits 950 and 960 belonging to the lowest class.

Supply voltages that are respectively provided to the circuits 930, 940, 950, and 960 belonging to the plurality of classes may be adjusted according to whether the switches 970 and 980 are open or closed.

For example, when the switch 970 is closed, and the switch 980 is open, the supply voltage Vp provided from the external power source 110 (of FIG. 1) may all be provided to the circuit 950 and the circuit 960 belonging to the lowest class. When the switch 970 is open, and the switch 980 is closed, the supply voltage Vp provided from the external power source 110 (of FIG. 1) may all be provided to the circuit 930 and the circuit 940 belonging to the highest class.

The opening and closing of the switch 970 and the switch 980 may be determined based on whether the plurality of classes of circuits 930, 940, 950, and 960 perform operation processing. For example, the integrated circuit 900 may be configured to control the switch 970 in such a manner that, when the circuit 930 and the circuit 940 belonging to the highest class do not perform operation processing, the switch 970 may be closed. Also, the integrated circuit 900 may be configured to control the switch 980 in such a manner that, when the circuit 950 and the circuit 960 belonging to the lowest class do not perform operation processing, the switch 980 may be closed.

Also, when at least one of the circuit 930 and the circuit 940 belonging to the highest class and at least one of the circuit 950 and the circuit 960 belonging to the lowest class perform operation processing, both of the switch 970 and the switch 980 may be open. In this regard, a distribution ratio between supply voltages that are distributed and provided to the circuits 930 and 940 belonging to the highest class and the circuits 950 and 960 belonging to the lowest class from the supply voltage of the external power source 110 (of FIG. 1) may be determined based on an operation throughput of the circuits 930 and 940 belonging to the highest class and an operation throughput of the circuits 950 and 960 belonging to the lowest class.

Figure 10:
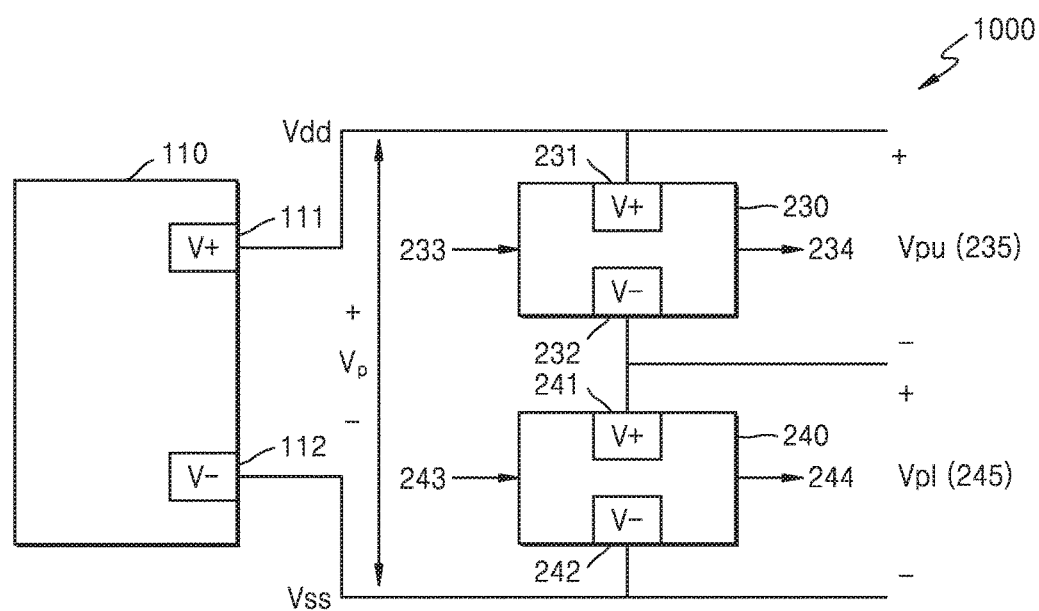
FIG. 10 is a diagram of a system for providing power to an integrated circuit, according to at least one example embodiment.

FIG. 10 is a diagram of a system for providing power to an integrated circuit 1000, according to at least one example embodiment. The integrated circuit 1000 of FIG. 10 is an example of the integrated circuit 100 of FIG. 1.

The system may include the integrated circuit 1000 and the power source 110 for providing power to the integrated circuit 1000.

The power source 110 may provide the input supply voltage Vp to the integrated circuit 1000 through the positive power supply terminal 111 having the voltage Vdd and the negative power supply terminal 112 having the voltage Vss. For example, the negative power supply terminal 112 of the power source 110 may be connected to a ground voltage.

The integrated circuit 1000 may include a plurality of circuits, for example, the highest class circuit 230 and the lowest class circuit 240. For example, the plurality of circuits, for example, the highest class circuit 230 and the lowest class circuit 240, may be core circuits.

The plurality of circuits, for example, the highest class circuit 230 and the lowest class circuit 240, may receive the input supply voltage Vp from the power source 110 through the positive power supply terminals 231 and 241 and the negative power supply terminals 232 and 242, respectively.

Referring to FIG. 10, the integrated circuit 1000 may include the highest class circuit 230 and the lowest class circuit 240. Also, the highest class circuit 230 and the lowest class circuit 240 may be core circuits that perform operation processing independently of each other.

The positive power supply terminal 231 of the highest class circuit 230 may be connected to the positive power supply terminal 111 of the power source 110. Also, the negative power supply terminal 232 of the highest class circuit 230 may be connected to the positive power supply terminal 241 of the lowest class circuit 240, which is an adjacent lower class circuit. Also, the negative power supply terminal 242 of the lowest class circuit 240 may be connected to the negative power supply terminal 112 of the power source 110.

The highest class circuit 230 may receive the supply voltage Vpu 235 which is at least a portion of the supply voltage Vp provided from the power source 110 based on an operation throughput. Also, the lowest class circuit 240 may receive the supply voltage Vpl 245, which is at least a portion of the part of the supply voltage Vp provided from the power source 110 that excludes the supply voltage Vpu 235 provided to the highest class circuit 230.

A distribution method of the supply voltage Vpu 235 and the supply voltage Vpl 245 is the same as described above with reference to FIG. 2, and thus, a repeated description thereof will be omitted from the description of FIG. 10.

Figure 11:
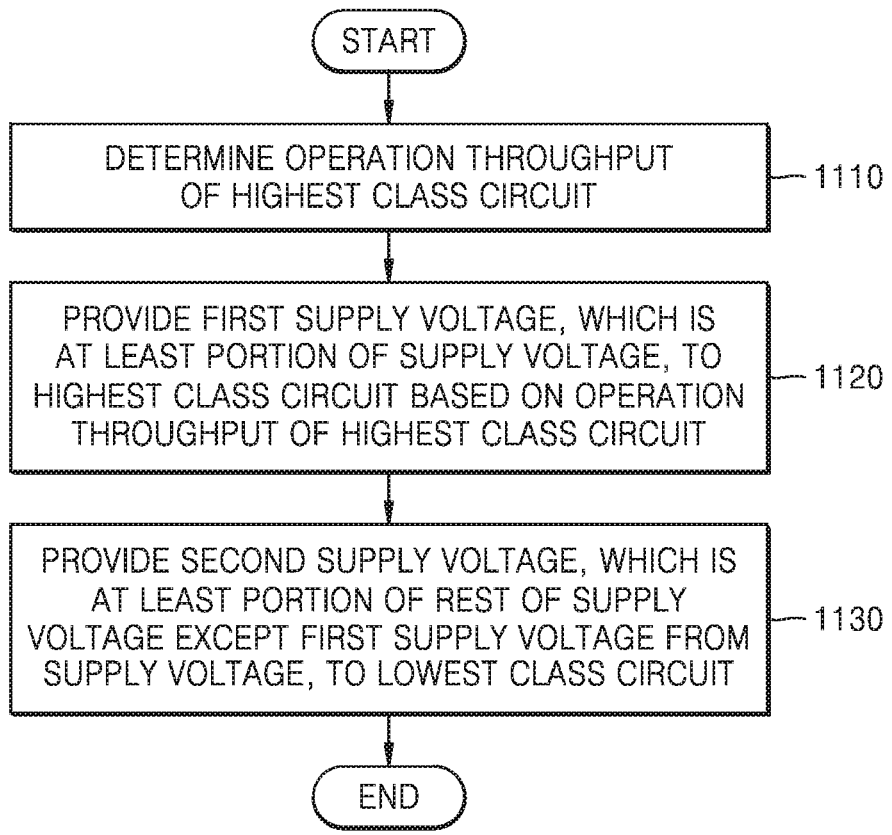
FIG. 11 is a flowchart of a method of providing power to an integrated circuit, according to at least one example embodiment.

FIG. 11 is a flowchart of a method of providing power to the integrated circuit 100, according to at least one example embodiment.

In operation 1110, an operation throughput of the highest class circuit 230 may be determined. The highest class circuit 230 may be a core circuit. For example, the operation throughput of the highest class circuit 230 may be determined by a processor that distributes input signals.

The operation throughput of the circuit may be determined based on the input signal 233 received by the highest class circuit 230. Also, the operation throughput of the highest class circuit 230 may be determined based on a change frequency of the input signal 233.

The change frequency of the input signal 233 during a desired or, alternatively, predetermined period may be determined. For example, the operation throughput of the circuit may be determined based on a frequency at which the input signal 233 is changed from the low voltage VL to the high voltage VH or from the high voltage VH to the low voltage VL during a desired or, alternatively, predetermined period.

In operation 1120, the supply voltage Vpu 235, which is at least a portion of a supply voltage, may be provided to the highest class circuit 230 based on the operation throughput of the highest class circuit 230.

The supply voltage Vpu 235 may be determined based on the operation throughput of the highest class circuit 230. For example, as the operation throughput of the highest class circuit 230 increases, the supply voltage Vpu 235 may decrease. Also, as the change frequency of the input signal 233 received by the highest class circuit 230 increases, the supply voltage Vpu 235 may decrease.

In operation 1130, the supply voltage Vpl 245, which is at least a portion of the part of the supply voltage provided from the external power source 110 (of FIG. 1) that excludes the supply voltage Vpu 235 may be provided to the lowest class circuit 240.

A distribution ratio between the supply voltage Vpu 235 and the supply voltage Vpl 245 from the supply voltage of the external power source 110 (of FIG. 1) may be determined based on the operation throughput of the highest class circuit 230 and an operation throughput of the lowest class circuit 240. For example, when a ratio of the operation throughput of the highest class circuit 230 to the operation throughput of the lowest class circuit 240 is high, a ratio of the supply voltage Vpu 235 to the supply voltage Vpl 245 may increase.

At least some of the example embodiments of the inventive concepts described above may be implemented by one or more processors executing computer programs. For example, according to at least some example embodiments, the computer programs executed by the one or more processors may include a plurality of computer-executable instructions corresponding to operations described above with respect to at least some example embodiments. According to at least some example embodiments, the computer programs may be stored on a computer-readable recording medium. Also, a structure of data used in at least some example embodiments of the inventive concepts may be recorded on the computer-readable recording medium through various means. Examples of the computer-readable recording medium include magnetic storage media (e.g., ROM, floppy disks, hard disks, etc.), optical recording media (e.g., CD-ROMs, DVDs, etc.), etc.

It should be understood that embodiments described herein should be considered in a descriptive sense only and not for purposes of limitation. Descriptions of features or aspects within each embodiment should typically be considered as available for other similar features or aspects in other embodiments.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. An integrated circuit comprising:
   a highest class core circuit that has a positive power supply terminal connected to a positive power supply terminal of an external power source, and is configured to receive a first supply voltage which is at least a portion of a an input supply voltage that is provided from the external power source based on an operation throughput;
   a lowest class core circuit that has a positive power supply terminal connected to a negative power supply terminal of an adjacent upper class core circuit, has a negative power supply terminal connected to a negative power supply terminal of the external power source, and is configured to receive a second supply voltage which is at least a portion of a part of the input supply voltage that excludes the first supply voltage;
   a first switch that connects the positive power supply terminal of the highest class core circuit to the negative power supply terminal of the highest class core circuit; and
   a second switch that connects the positive power supply terminal of the lowest class core circuit to the negative power supply terminal of the lowest class core circuit, wherein opening and closing of the first switch and the second switch are determined based on an operation throughput of each of the highest class core circuit and the lowest class core circuit, and wherein a distribution ratio between the first supply voltage and the second supply voltage from the input supply voltage is determined based on the operation throughput of each of the highest class core circuit and the lowest class core circuit.

2. The integrated circuit of claim 1, wherein the adjacent upper class core circuit of the lowest class core circuit is the highest class core circuit.

3. The integrated circuit of claim 2, wherein the highest class core circuit and the lowest class core circuit are configured such that the operation throughput of each of the highest class core circuit and the lowest class core circuit depends on a change frequency of an input signal that is received by each of the highest class core circuit and the lowest class core circuit.

4. The integrated circuit of claim 3, wherein the highest class core circuit and the lowest class core circuit are configured such that the operation throughput of each of the highest class core circuit and the lowest class core circuit increases as the change frequency of the input signal that is received by each of the highest class core circuit and the lowest class core circuit increases.

5. The integrated circuit of claim 1, further comprising:
a third core circuit that has a positive power supply terminal connected to the negative power supply terminal of the highest class core circuit, and is configured to receive a third supply voltage which is at least a portion of the part of the input supply voltage that excludes the first supply voltage and the second supply voltage.

6. The integrated circuit of claim 5, wherein a distribution ratio between the first supply voltage, the second supply voltage, and the third supply voltage from the input supply voltage is determined based on an operation throughput of each of the highest class core circuit, the lowest class core circuit, and the third core circuit.

7. The integrated circuit of claim 1, further comprising:
a core circuit that has a positive power supply terminal connected to a positive power supply terminal of a fourth core circuit belonging to an upper class than the lowest class core circuit, has a negative power supply terminal connected to a fifth core circuit belonging to a lower class than the fourth core circuit, and is configured to receive at least a portion of the part of the input supply voltage that excludes the first supply voltage and the second supply voltage.

8. The integrated circuit of claim 7, wherein at least one of the fourth core circuit and the fifth core circuit is a middle class core circuit that is different from the highest class core circuit and the lowest class core circuit.

9. The integrated circuit of claim 7, wherein the fourth core circuit is the highest class core circuit, and the fifth core circuit is the lowest class core circuit.

10. A method of distributing and providing an input supply voltage that is provided from a power source to an integrated circuit including at least a highest class core circuit and a lowest class core circuit, the method comprising:
determining an operation throughput of each of the highest class core circuit and the lowest core circuit;
determining, based on the operation throughput, a distribution ratio between a first supply voltage and a second supply voltage from the input supply voltage providing, based on the determined distribution ratio, the first supply voltage which is at least a portion of the input supply voltage to the highest class core circuit; and providing the second supply voltage which is at least a portion of a part of the input supply voltage that excludes the first supply voltage to the lowest class core circuit, wherein the integrated circuit further comprises a first switch that connects a positive power supply terminal of the highest class core circuit to a negative power supply terminal of the highest class core circuit, and a second switch that connects a positive power supply terminal of the lowest class core circuit to a negative power supply terminal of the lowest class core circuit, and wherein opening and closing of the first switch and the second switch are determined based on an operation throughput of each of the highest class core circuit and the lowest class core circuit.

11. The method of claim 10, wherein the operation throughput of each of the highest class core circuit and the lowest class core circuit depends on a change frequency of an input signal that is received by each of the highest class core circuit and the lowest class core circuit.

12. The method of claim 10, further comprising:
adjusting, based on whether an operation throughput of the highest class core circuit changes, the first supply voltage that is provided to the highest class core circuit.

13. The method of claim 12, wherein the adjusting of the first supply voltage comprises decreasing the first supply voltage as the operation throughput of the highest class core circuit increases.

14. A system for providing power to an integrated circuit, the system comprising:
a power source that provides an input supply voltage to the integrated circuit through a positive power supply terminal and a negative power supply terminal;
a highest class core circuit that has a positive power supply terminal connected to the positive power supply terminal of the power source, and is configured to receive a first supply voltage which is at least a portion of the input supply voltage based on an operation throughput; and
a lowest class core circuit that has a positive power supply terminal connected to a negative power supply terminal of an adjacent upper class core circuit, has a negative power supply terminal connected to the negative power supply terminal of the power source, and is configured to receive a second supply voltage which is at least a portion of a part of the input supply voltage that excludes the first supply voltage from the input supply voltage;
a first switch that connects the positive power supply terminal of the highest class core circuit to the negative power supply terminal of the highest class core circuit; and
a second switch that connects the positive power supply terminal of the lowest class core circuit to the negative power supply terminal of the lowest class core circuit,
wherein opening and closing of the first switch and the second switch are determined based on an operation throughput of each of the highest class core circuit and the lowest class core circuit, and
wherein a distribution ratio between the first supply voltage and the second supply voltage from the input supply voltage is determined based on the operation throughput of each of the highest class core circuit and the lowest class core circuit.

15. The system of claim 14, wherein the highest class core circuit and the lowest class core circuit are configured such that the operation throughput of each of the highest class core circuit and the lowest class core circuit depends on change frequencies of input signals that are received by each of the highest class core circuit and the lowest class core circuit, respectively.

16. The system of claim 15, wherein the highest class core circuit and the lowest class core circuit are configured such that,
   the operation throughput of the highest class core circuit increases as the change frequency of the input signal that is received by the highest class core circuit increases, and
   the operation throughput of the lowest class core circuit increases as the change frequency of the input signal that is received by the lowest class core circuit increases.

* * * * *